US012490547B2

(12) United States Patent
Feng et al.

(10) Patent No.: US 12,490,547 B2
(45) Date of Patent: Dec. 2, 2025

(54) SOLAR CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Xiu Feng, Zhejiang (CN); Menglei Xu, Zhejiang (CN); Jie Yang, Zhejiang (CN); Xinyu Zhang, Zhejiang (CN)

(73) Assignees: Zhejiang Jinko Solar Co., Ltd., Haining (CN); Jinko Solar Co., Ltd., Jiangxi (CN)

( * ) Notice: Subject to any disclaimer, the term of this patent is extended or adjusted under 35 U.S.C. 154(b) by 0 days.

(21) Appl. No.: 18/955,649

(22) Filed: Nov. 21, 2024

(65) Prior Publication Data

US 2025/0081664 A1 Mar. 6, 2025

Related U.S. Application Data

(63) Continuation of application No. 18/369,011, filed on Sep. 15, 2023, now Pat. No. 12,191,409, which is a (Continued)

(30) Foreign Application Priority Data

Jun. 8, 2022 (CN) ......................... 202210647861.3

(51) Int. Cl.
*H10F 77/20* (2025.01)
*H10F 19/80* (2025.01)
(Continued)

(52) U.S. Cl.
CPC ......... *H10F 77/219* (2025.01); *H10F 19/807* (2025.01); *H10F 19/908* (2025.01); *H10F 71/1375* (2025.01)

(58) Field of Classification Search
CPC .. H10F 19/807; H10F 19/908; H10F 71/1375; H10F 77/211; H10F 77/219; H10F 77/70; H10F 77/707
See application file for complete search history.

(56) References Cited

U.S. PATENT DOCUMENTS

2009/0308438 A1* 12/2009 De Ceuster ........... H10F 10/146 257/E31.032
2009/0308457 A1 12/2009 Smith
(Continued)

FOREIGN PATENT DOCUMENTS

AU 2022355671 A1 4/2024
CN 113921625 A 1/2022
(Continued)

OTHER PUBLICATIONS

Machine translation of WO-2020090423-A1, Kanematsu Masanori. (Year: 2020).*
(Continued)

*Primary Examiner* — Mayla Gonzalez Ramos
(74) *Attorney, Agent, or Firm* — Knobbe, Martens, Olson & Bear, LLP

(57) ABSTRACT

A solar cell including: substrate having front and back surfaces, the back surface includes first, second and gap regions, the first and second regions are staggered and spaced from each other in a first direction, and each gap region is provided between adjacent first and second regions, first pyramidal texture structure regions are formed corresponding to gap regions and distance between top and bottom thereof is 2-4 μm; first conductive layer formed over the first region; second conductive layer formed over the second region, the second conductive layer has conductivity type opposite to the first conductive layer; first electrode forming electrical contact with the first conductive layer; second electrode forming electrical contact with the second
(Continued)

conductive layer; and boundary region between the gap region and the first and/or second conductive layer adjacent thereto, and the boundary region includes strip or line patterned texture structures arranged at intervals.

20 Claims, 7 Drawing Sheets

Related U.S. Application Data continuation of application No. 17/879,598, filed on Aug. 2, 2022, now Pat. No. 11,799,040.

(51) Int. Cl.
*H10F 19/90* (2025.01)
*H10F 71/00* (2025.01)

(56) References Cited

U.S. PATENT DOCUMENTS

| | | | |
|---|---|---|---|
| 2014/0345685 | A1 | 11/2014 | Albaugh et al. |
| 2016/0005914 | A1 | 1/2016 | Bateman |

FOREIGN PATENT DOCUMENTS

| | | | | |
|---|---|---|---|---|
| CN | 114038921 | A | 2/2022 | |
| JP | 2011523230 | A | 8/2011 | |
| JP | 2012049183 | A | 3/2012 | |
| JP | 2017511597 | A | 4/2017 | |
| KR | 20150049211 | A | 5/2015 | |
| KR | 20180067782 | A | 6/2018 | |
| WO | 2012132615 | A1 | 10/2012 | |
| WO | 2013098955 | A1 | 7/2013 | |
| WO | 2016114271 | A1 | 7/2016 | |
| WO | 2016143698 | A1 | 9/2016 | |
| WO | 2019111491 | A1 | 6/2019 | |
| WO | WO-2020090423 | A1 * | 5/2020 | ............ H10D 64/20 |
| WO | 2021201030 | A1 | 10/2021 | |
| WO | 2021221049 | A1 | 11/2021 | |

OTHER PUBLICATIONS

European Search Report issued in corresponding EP Application 22187810.1, issued May 17, 2023 (6 pages).
Japanese Grant of Patent for Application No. 2022-113428, mailed Feb. 6, 2024 (5 pages).
Japanese Office Action for Application No. 2024-020441, mailed May 7, 2024 (8 pages).
Search Report of corresponding Singapore Patent Application No. 10202301597R issued on Apr. 26, 2024 (8 pages).
U.S. Office Action for Application No. 1787959.8, mailed Feb. 2, 2023 (22 pages).
Japanese Office Action for Application No. JP 2022-113428 dated Jun. 6, 2023 in 12 pages.
Australian Office Action for Application No. 2022209227 dated Jul. 20, 2023 in 7 pages.
Japanese Office Action for Application No. JP 2022-113428 dated Oct. 26, 2023.

* cited by examiner

SOLAR CELL AND PHOTOVOLTAIC MODULE

CROSS-REFERENCE TO RELATED APPLICATIONS

The present application is a continuation of U.S. patent application Ser. No. 18/369,011, filed on Sep. 15, 2023, which is a continuation of U.S. patent application Ser. No. 17/879,598, filed on Aug. 2, 2022, which claims priority to Chinese Application No. 202210647861.3, filed on Jun. 8, 2022, the contents of which are incorporated herein by reference in their entireties.

TECHNICAL FIELD

The present disclosure relates to the technical field of photovoltaic cells, and in particular, to a solar cell and a photovoltaic module.

BACKGROUND

An Interdigitated Back Contact (IBC) solar cell has a light receiving surface with no electrode arranged thereon, while positive and negative electrodes are arranged in an interdigitated manner on a backlight surface of the solar cell. Compared with the solar cell with a partially shielded light receiving surface, the IBS solar cell has a higher short-circuit current and thus a higher photoelectric conversion efficiency.

Separated doped regions of existing IBC solar cells are mainly manufactured by: 1) photolithography, in which separated boron-doped region and phosphorus-doped region are formed through multiple times of mask lithography; 2) ion implantation technology, in which ions are injected into a certain region to form separated boron-doped region and phosphorus-doped region through mask and laser slotting; or 3) doping paste printing, in which a diffusion region is formed through mask and laser slotting, and then boron/phosphorus slurry is printed to form a doped region. The photolithography is expensive, the ion implantation technology is unstable in doping, and doping paste printing has excessive printing and cleaning steps.

SUMMARY

In view of the above problems, the present disclosure provides a solar cell and a photovoltaic module, so as to solve the technical problems in the related art, which can separate a boron-doped region and a phosphorus-doped region of the IBC solar cell, prevent bipolar contact recombinations, and thus improve the efficiency of the IBC solar cell.

In a first aspect, the present disclosure provides a solar cell, including: a substrate having a front surface and a back surface opposite to the front surface, the back surface includes first regions, second regions and gap regions, the first regions and the second regions are staggered and spaced from each other in a first direction, and each gap region is provided between one first region and one second region adjacent to the first region, first pyramidal texture structure regions are formed on the back surface corresponding to the gap regions and a distance between a top surface and a bottom surface of the first pyramidal texture structure region ranges from 2 μm to 4 μm; a first conductive layer formed over the first region; a second conductive layer formed over the second region, the second conductive layer has a conductivity type opposite to the first conductive layer; a first electrode forming electrical contact with the first conductive layer; a second electrode forming electrical contact with the second conductive layer; and a boundary region between the gap region and the first conductive layer and/or the second conductive layer adjacent thereto, and the boundary region includes strip or line patterned texture structures arranged at intervals and configured to increase reflection of incident light on the back surface of the substrate In one or more embodiments, second pyramidal texture structure regions are formed on the back surface corresponding to the first conductive layer and/or the second conductive layer.

In one or more embodiments, quadrangular frustum pyramid texture structure regions are formed on the back surface corresponding to the first conductive layer and/or the second conductive layer.

In one or more embodiments, two opposite ends of the strip or line patterned texture structures are respectively in contact with the first pyramidal texture structure regions and the second pyramidal texture structure regions.

In one or more embodiments, the solar cell further includes a back passivation layer formed over a surface of the first conductive layer, a surface of the second conductive layer, and a surface of the gap region, the first electrode penetrates through the back passivation layer to form electrical contact with the first conductive layer, and the second electrode penetrates through the back passivation layer to form electrical contact with the second conductive layer.

In one or more embodiments, a front passivation layer is formed over the front surface of the substrate.

In one or more embodiments, the first conductive layer is formed on the back surface of the substrate or formed into the back surface of the substrate.

In one or more embodiments, the substrate is an N-type substrate, the first conductive layer includes a P-type doped layer, and the second conductive layer includes an N-type doped layer.

In one or more embodiments, the first conductive layer is formed by doping a preset region of the back surface of the substrate with a P-type dopant by means of deposition, diffusion, or printing.

In one or more embodiments, substrate is a P-type substrate, the first conductive layer comprises a P-type doped layer, and the second conductive layer comprises an N-type doped layer.

In one or more embodiments, an opening is provided on the back surface of the substrate to expose the P-type substrate, and the first electrode is formed in the opening and in direct contact with the P-type substrate.

In one or more embodiments, a dielectric layer is formed between at least one of the first conductive layer or the second conductive layer and the back surface of the substrate.

In one or more embodiments, the dielectric layer includes silicon oxide, aluminum oxide, hafnium oxide, silicon nitride, or silicon oxynitride.

In one or more embodiments, the dielectric layer has a thickness in a range of 0.5 nm to 3 nm.

In one or more embodiments, the dielectric layer does not cover the back surface of the substrate corresponding to the gap regions.

In one or more embodiments, a distance between a top surface and a bottom surface of the first pyramidal texture structure regions ranges from 2 μm to 4 μm.

In one or more embodiments, a distance between a top surface and a bottom surface of the second pyramidal texture structure regions ranges from 1 μm to 3 μm.

In one or more embodiments, an extent of the boundary region in the first direction ranges from 3 μm to 5 μm.

In one or more embodiments, a distance between a top surface and a bottom surface of the strip or line patterned texture structures ranges from 1 μm to 4 μm.

In one or more embodiments, an extent of the gap region in a normal direction of the back surface of the substrate ranges from 1 μm to 6 μm.

In one or more embodiments, a ratio of an area of the gap regions to an area of the back surface of the substrate ranges from 10% to 35%.

The present disclosure further provides a method for manufacturing a solar cell, including: providing a substrate having a front surface and a back surface opposite to the front surface, the back surface has first regions, second regions and gap regions, the first regions and second regions staggered and spaced from each other in a first direction, each gap region is formed between one first region and one second region adjacent to the first region by recessing toward an interior of the substrate; forming a first conductive layer over the back surface of the substrate; performing laser ablation on the back surface of the substrate to remove the first conductive layer located in the second region and the gap region; forming a second conductive layer over the gap region and the second region; forming a first protective layer over a surface of the second conductive layer corresponding to the second region; removing the second conductive layer not covered by the first protective layer; removing the first protective layer; performing texturing to form first pyramidal texture structure regions on the back surface corresponding to the gap regions and form second pyramidal texture structure regions on the second conductive layer, boundary regions are formed between adjacent first pyramidal texture structure regions and adjacent second pyramidal texture structure regions, and the back surface is provided with a line-pattern concave and convex texture structure at the boundary region; and forming a first electrode on the first conductive layer, and forming a second electrode on the second conductive layer.

The present disclosure further provides a photovoltaic module, including: a solar cell string formed by connecting a plurality of solar cells; an encapsulation layer configured to cover a surface of the solar cell string; and a cover plate configured to cover a surface of the encapsulation layer away from the solar cell string. At least one of the plurality of solar cells includes: a substrate having a front surface and a back surface opposite to the front surface, the back surface includes first regions, second regions and gap regions, the first regions and the second regions are staggered and spaced from each other in a first direction, and each gap region is provided between one first region and one second region adjacent to the first region, first pyramidal texture structure regions are formed on the back surface corresponding to the gap regions and a distance between a top surface and a bottom surface of the first pyramidal texture structure region ranges from 2 μm to 4 μm; a first conductive layer formed over the first region; a second conductive layer formed over the second region, the second conductive layer has a conductivity type opposite to the first conductive layer; a first electrode forming electrical contact with the first conductive layer; a second electrode forming electrical contact with the second conductive layer; and a boundary region between the gap region and the first conductive layer and/or the second conductive layer adjacent thereto, and the boundary region includes strip or line patterned texture structures arranged at intervals and configured to increase reflection of incident light on the back surface of the substrate.

BRIEF DESCRIPTION OF DRAWINGS

FIG. 1-2 is another schematic structural diagram of the solar cell according to one or more embodiments of the present disclosure;

FIG. 1-3 is another schematic structural diagram of the solar cell according to one or more embodiments of the present disclosure;

FIG. 2 is a scanning electron microscope (SEM) diagram of a gap region and a second conductive layer of a solar cell according to one or more embodiments of the present disclosure;

FIG. 3 is a partially enlarged view of FIG. 2;

DESCRIPTION OF EMBODIMENTS

Embodiments described below with reference to the accompanying drawings are illustrative and are only intended to explain the present disclosure and not to be interpreted as a limitation on the present disclosure.

An interdigitated back contact solar cell is also referred to as an IBC solar cell. It is an urgent technical problem to improve the efficiency of the IBC solar cell while effectively separating a boron-doped region and a phosphorus-doped region of the IBC solar cell.

Figure 1:
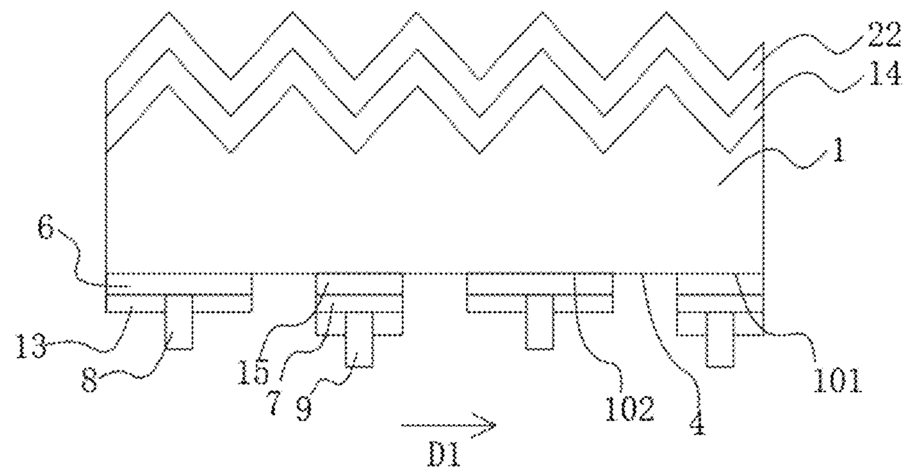
FIG. 1-1 is a schematic structural diagram of a solar cell according to one or more embodiments of the present disclosure.
Figures 1, 2:
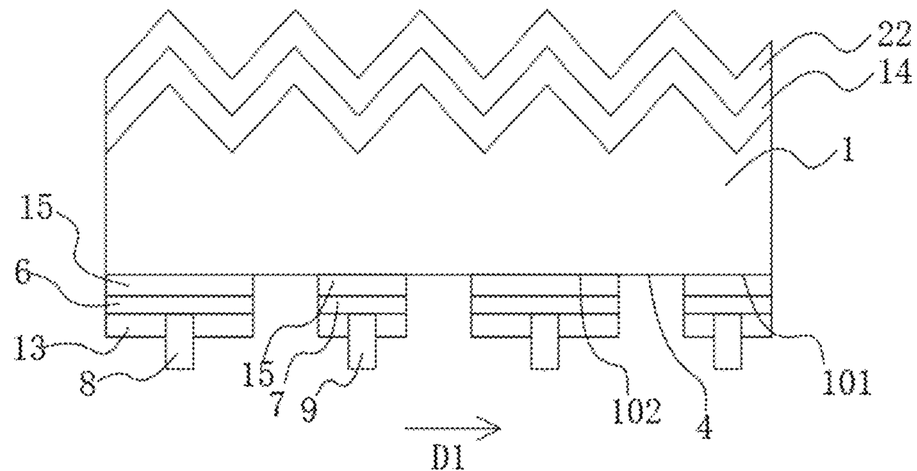
Figures 1, 2, 3:
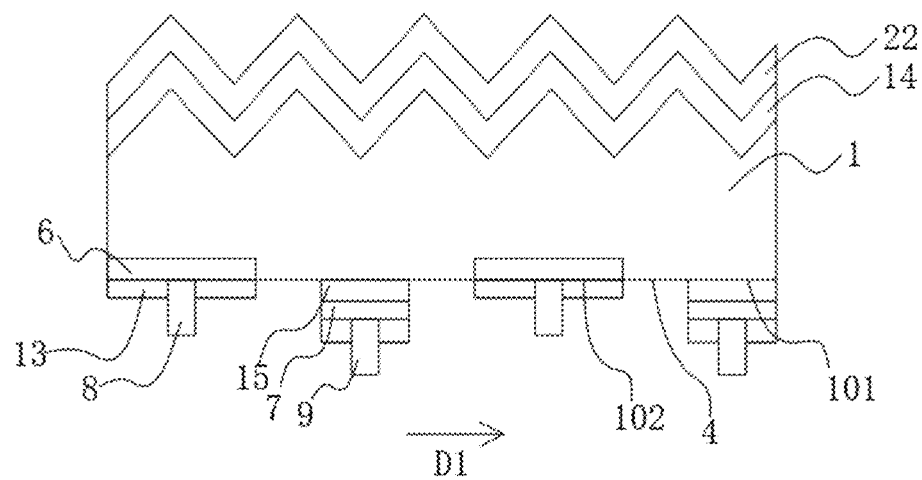
Figure 2:
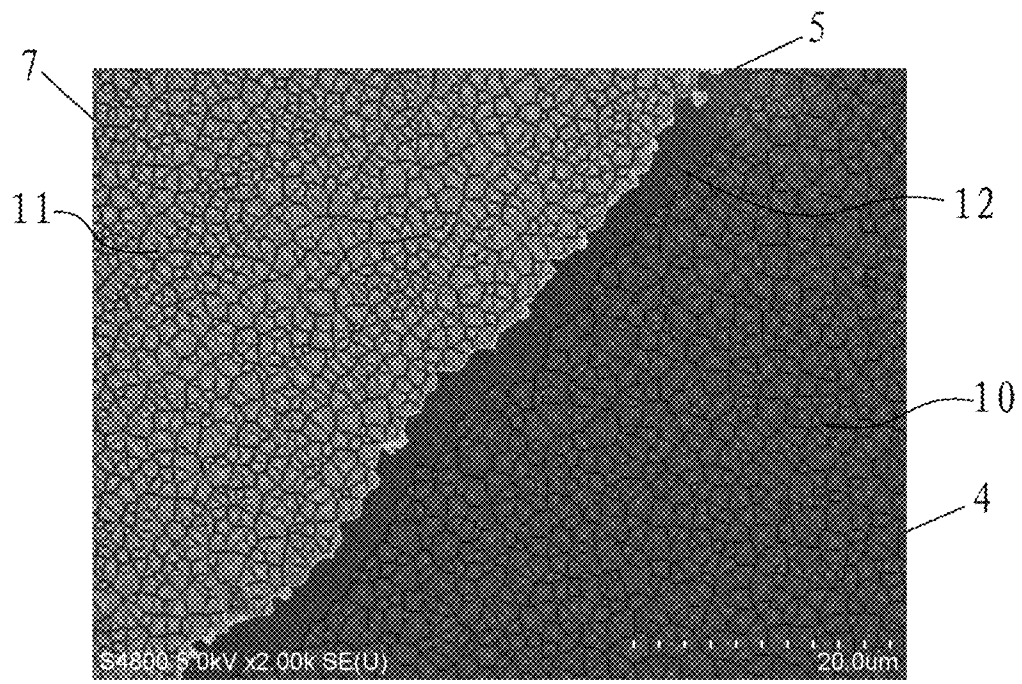
Figure 3:
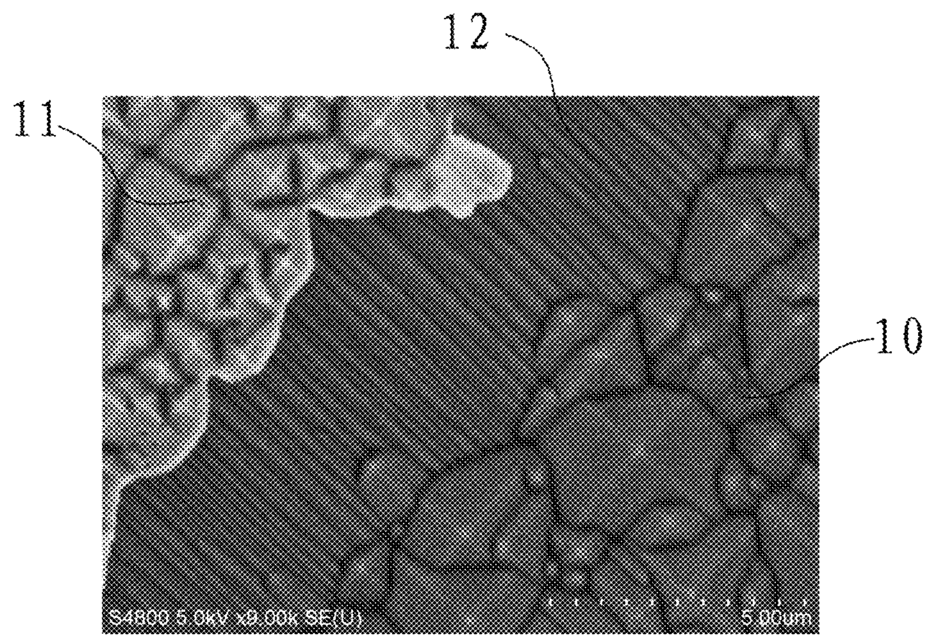

In order to solve the above technical problem, an embodiment of the present disclosure provides a solar cell. The solar cell is an IBC solar cell. As shown in FIG. 1-1, FIG. 1-2 or FIG. 1-3, the solar cell at least includes a substrate 1, a first conductive layer 6, a second conductive layer 7, a first electrode 8, and a second electrode 9.

The substrate 1 has a front surface 2 and a back surface 3 opposite to the front surface 2. The front surface 2 is a light receiving surface facing the direction of sunlight, and the back surface 3 is a surface opposite to the front surface 2.

The substrate 1 may be, for example, a crystalline semiconductor (e.g., crystalline silicon) including a dopant of a first conductivity type. The crystalline semiconductor may be monocrystalline silicon, and the dopant of the first conductivity type may be an N-type dopant including Group V elements such as phosphorus (P), arsenic (As), bismuth (Bi), and stibium (Sb), or a P-type dopant including Group III elements such as boron (B), aluminum (Al), gallium (Ga), and indium (In).

The back surface 3 has first regions 101 and second regions 102 staggered and spaced from each other in a first direction D1. Gap regions 4 recessed toward the interior of the substrate 1 are provided between adjacent first and second regions 101, 102. The first conductive layer 6 is formed over the first region 101. The second conductive layer 7 is formed over the second region 102. The second conductive layer 7 is of a conductivity type opposite to the first conductive layer 6. The gap region 4 is configured to physically separate the first conductive layer 6 from the second conductive layer 7, so that the first conductive layer 6 is insulated from the second conductive layer 7 or the first electrode 8 is insulated from the second electrode 9 to prevent short circuit of positive and negative electrodes of the solar cell or leakage of the solar cell, thereby improving reliability of the solar cell.

The first electrode 8 forms electrical contact with the first conductive layer 6, and the second electrode 9 forms electrical contact with the second conductive layer 7. In some embodiments, the first electrode 8 and the second electrode 9 are made from at least one conductive metal material such as silver, aluminum, copper, and nickel.

Referring to FIG. 2 and FIG. 3, a plurality of first pyramidal texture structure regions 10 are formed on the back surface 3 corresponding to the gap regions 4. The first pyramidal texture structure regions 10 may be formed through a texturing (or etching) process. The texturing process may be chemical etching, laser etching, mechanical etching, plasma etching, or the like. The first pyramidal texture structure regions 10 can bring good light trapping and antireflection effects, so that light incident on the back surface 3 can also be utilized, which increases an effective contact area of the light, realizes further utilization of light energy, and thus improves power generation efficiency.

In some embodiments, a plurality of first pyramidal texture structure regions 10, for example, stepped flat texture structures, are formed on the back surface 3 corresponding to the first regions 101 and the second regions 102, respectively.

Second pyramidal texture structure regions 11 are formed on the first conductive layer 6. The second pyramidal texture structure regions 11 may be formed through a texturing (or etching) process. The texturing process may be chemical etching, laser etching, mechanical etching, plasma etching, or the like. The second pyramidal texture structure regions 11 have good light trapping and antireflection effects, so that light incident on the back surface 3 can also be utilized, which increases an effective contact area of the light, realizes further utilization of light energy, and thus improves power generation efficiency of the solar cell.

In one or more embodiments, different from the first pyramidal texture structure regions 10 and the second pyramidal texture structure regions 11, a plurality of quadrangular frustum pyramid texture structure regions (not shown) are formed on the back surface 2 corresponding to the first conductive layer 6 and/or the second conductive layer 7. The quadrangular frustum pyramid texture structure regions may also bring good light trapping and antireflection effects.

Still referring to FIG. 2 and FIG. 3, boundary regions 5 are formed between adjacent first pyramidal texture structure regions 10 and adjacent second pyramidal texture structure regions 11, and the back surface 3 is provided with a line-pattern concave and convex texture structure 12 at the boundary region 5. Different light trapping structures are formed between the line-pattern concave and convex texture structure 12 and a surface of the first pyramidal texture structure region 10 and/or the second pyramidal texture structure region 11, which can reduce interface recombinations, increase reflection of incident light on the back surface 3 of the substrate 1, and increase the amount of light absorbed by the solar cell. As a result, the light has a chance to be reused by the solar cell, thereby improving photoelectric conversion efficiency of the IBC solar cell.

Referring to FIG. 3, the line-pattern concave and convex texture structures 12 are strip or line patterned texture structures arranged at intervals, and a plurality of strip or line patterned texture structures are parallel to one another. Two opposite ends of the strip or line patterned texture structures are in contact with the first pyramidal texture structure regions 10 and the second pyramidal texture structure regions 11, respectively. Reflectivity of incident light on the back of the solar cell can be increased by 2% to 6%, so that more incident light is reflected and absorbed again into the substrate 1 after reaching the back of the solar cell, thereby further improving the photoelectric conversion efficiency by 0.07% to 0.15%.

As shown in FIG. 1-1 or FIG. 1-2, the solar cell is an N-type solar cell. The substrate 1 is an N-type crystalline silicon substrate 1, the first conductive layer 6 includes a P-type doped layer (i.e., emitter), and the second conductive layer 7 includes an N-type doped layer (i.e., base).

In some embodiments, as shown in FIG. 1-1, the first conductive layer 6 is formed inside or over the back surface 4 of the substrate 1. For example, the first conductive layer 6 is formed by doping a preset region of the back surface 4 of the substrate 1 with a P-type dopant by means of such as deposition, diffusion, or printing. In this case, the P-type dopant has any impurity of a conductivity type opposite to the substrate 1. That is, a Group III element such as boron (B), aluminum (Al), gallium (Ga), or indium (In) may be used. The first conductive layer 6 has a same crystal structure as the substrate 1, for example, monocrystalline silicon. A dielectric layer 15 is provided between the second conductive layer 7 and the substrate 1. In some embodiments, the dielectric layer 15 includes one or more of silicon oxide, aluminum oxide, hafnium oxide, silicon nitride, and silicon oxynitride. The second conductive layer 7 is formed by doping amorphous silicon, microcrystalline silicon, or polycrystalline silicon with an N-type dopant. The N-type dopant may be any dopant having a same conductivity type as the substrate 1. That is, a Group V element such as phosphorus (P), arsenic (As), bismuth (Bi), or stibium (Sb) may be used. In an embodiment, the second conductive layer 7 is a phosphorus-doped polysilicon layer. The second conductive layer 7 has a different crystal structure from the substrate 1.

In some embodiments, as shown in FIG. 1-2, the second conductive layer 7 is the same as the second conductive layer 7 in FIG. 1-1, which is not described in detail herein. The difference lies in that the dielectric layer 15 is also arranged between the first conductive layer 6 and the substrate 1. In some embodiments, the dielectric layer 15 includes one or more of silicon oxide, aluminum oxide, hafnium oxide, silicon nitride, and silicon oxynitride, and the first conductive layer 6 is generally formed by doping amorphous silicon, microcrystalline silicon, or polycrystalline silicon with a P-type dopant. That is, a P-type dopant of a Group III element such as boron (B), aluminum (Al), gallium (Ga), or indium (In) may be used. For example, the first conductive layer 6 is a boron-doped polysilicon layer. The first conductive layer 6 has a different crystal structure from the substrate 1.

In some embodiments, referring to FIG. 1-3, the solar cell is a P-type solar cell. That is, the substrate 1 is a P-type crystalline silicon substrate, the first conductive layer 6 includes a P-type doped layer (i.e., base), and the second conductive layer 7 includes an N-type doped layer (i.e., emitter).

The P-type doped layer may form an opening above the substrate 1 through a process such as laser etching, dry etching, wet etching, or mechanical etching to expose the P-type crystalline silicon substrate, and then the first electrode 8 may be directly formed on the back surface 4 of the P-type crystalline silicon substrate, so that the first electrode 8 comes into contact with the back surface 4 to facilitate metal atoms in the first electrode 8 to be diffused into the back surface 3 to form a base layer. The P-type doped layer includes an alloy layer (e.g., an Al—Si alloy layer) formed by a metal electrode and the substrate 1.

A dielectric layer 15 is arranged between the second conductive layer 7 and the substrate 1. In some embodiments, the dielectric layer 15 includes one or more of silicon oxide, aluminum oxide, hafnium oxide, silicon nitride, and silicon oxynitride. The second conductive layer 7 is formed by doping amorphous silicon, microcrystalline silicon, or polycrystalline silicon with an N-type dopant. The N-type dopant may be any dopant having a same conductivity type as the substrate 1. That is, a Group V element such as phosphorus (P), arsenic (As), bismuth (Bi), or stibium (Sb) may be used.

In some embodiments, the structure of the IBC solar cell according to the present disclosure is described with an example with the substrate 1 being an N-type crystalline silicon substrate.

Figure 15:
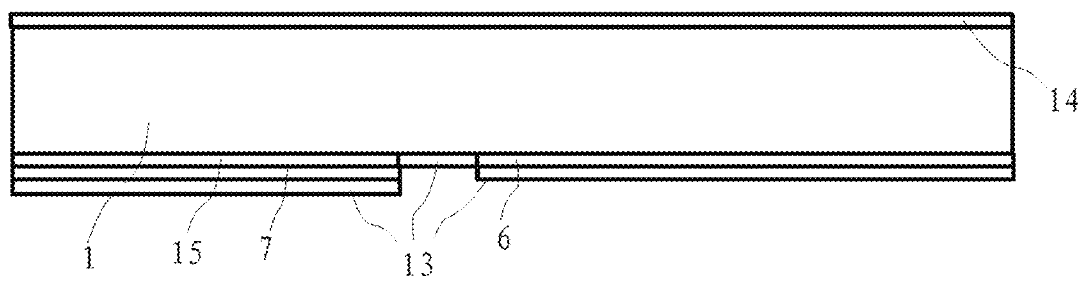
FIG. 15 is a twelfth schematic structural diagram of a solar cell during manufacturing according to one or more embodiments of the present disclosure.
Figure 16:
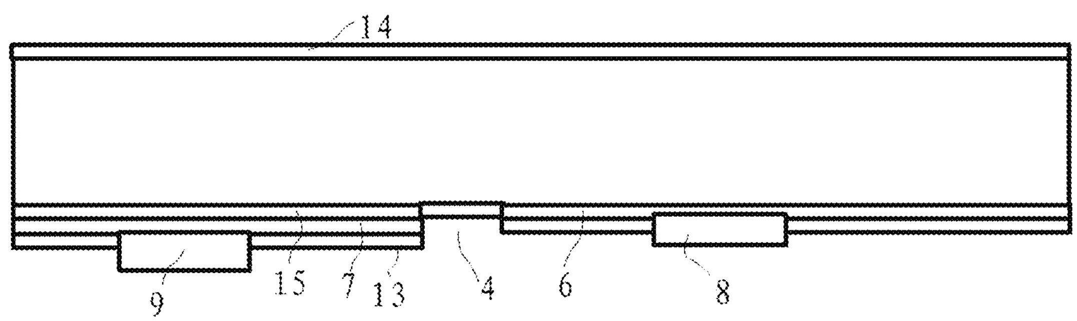
FIG. 16 is a thirteenth schematic structural diagram of a solar cell during manufacturing according to one or more embodiments of the present disclosure.

Referring to FIG. 1-1, FIG. 15, and FIG. 16, the solar cell further includes a back passivation layer 13. The back passivation layer 13 may perform passivation on the back surface of the solar cell and dangling bonds at the first conductive layer 6, the second conductive layer 7, and the gap region 4, which reduces a carrier recombination speed of the back surface 3 and thus improves the photoelectric conversion efficiency. The back passivation layer 13 is located on a surface of the first conductive layer 6, a surface of the second conductive layer 7, and a surface of the gap region 4. The first electrode 8 penetrates through the back passivation layer 13 to form electrical contact with the first conductive layer 6. The second electrode 9 penetrates through the back passivation layer 13 to form electrical contact with the second conductive layer 7. In some embodiments, the back passivation layer 13 may be provided with an opening to allow the first electrode 8 and the second electrode 9 to pass therethrough to electrically contact with the first conductive layer 6 and the second conductive layer 7, respectively, so as to reduce the contact area among the metal electrode, the first conductive layer 6 and the second conductive layer 7, which further reduces contact resistance, and thus increases an open-circuit voltage.

For example, the back passivation layer 13 includes a stack structure of at least one or more of a silicon oxide layer, a silicon nitride layer, an aluminum oxide layer, or a silicon oxynitride layer.

In some embodiments, the back passivation layer 13 has a thickness in a range of 10 nm to 120 nm, which may be, for example, 10 nm, 20 nm, 30 nm, 40 nm, 50 nm, 60 nm, 70 nm, 80 nm, 90 nm, 100 nm, 120 nm, or the like, and may also be other values in the range, which is not limited herein.

In some embodiments, a front passivation layer 14 is formed on the front surface 2 of the substrate 1. The front passivation layer 14 may perform passivation on the front surface 2 of the substrate 1, which reduces recombinations of carriers at an interface and improves transport efficiency of the carriers, thereby improving the photoelectric conversion efficiency of the IBC solar cell.

In some embodiments, the front passivation layer 14 includes a stack structure of at least one or more of a silicon oxide layer, a silicon nitride layer, an aluminum oxide layer, or a silicon oxynitride layer.

In some embodiments, an antireflection layer 22 is further formed over a surface of the front passivation layer 14. The antireflection layer 22 may reduce reflection of incident light and improve refraction of light, thereby improving the utilization of the light and the photoelectric conversion efficiency. In some embodiments, similar to the antireflection layer 22, the front passivation layer 14 may also reduce the reflection of the incident light.

In some embodiments, an ultra-thin dielectric layer 15 is formed between at least one of the first conductive layer 6 and the second conductive layer 7 and the back surface 3 of the substrate 1. The dielectric layer 15 is configured to perform passivation on an interface of the back surface 3 of the substrate 1, which reduces recombinations of carriers at the interface and ensures transport efficiency of the carriers. Referring to FIG. 9 to FIG. 16, the dielectric layer 15 is formed between the second conductive layer 7 and the back surface 3 of the substrate 1.

In some embodiments, the dielectric layer 15 includes one or more of silicon oxide, aluminum oxide, hafnium oxide, silicon nitride, or silicon oxynitride.

In some embodiments, the dielectric layer 15 has a thickness in a range of 0.5 nm to 3 nm. If the thickness of the dielectric layer 15 is excessively large, the tunneling effect of majority carriers will be affected, and it is difficult to transport the carriers through the dielectric layer 15, thereby adversely affecting tunneling and passivation effects of the dielectric layer 15 and gradually decreasing the photoelectric conversion efficiency of the solar cell. If the thickness of the dielectric layer 15 is excessively small, it is not conducive to the contact with electrode slurry. In some embodiments, the dielectric layer 15 has a thickness in a range of 0.5 nm to 3 nm. For example, the thickness of the dielectric layer 13 may be 0.5 nm, 0.9 nm, 1.0 nm, 1.2 nm, 1.4 nm, 1.6 nm, 1.8 nm, 2.0 nm, 2.2 nm, 2.4 nm, 2.6 nm, 2.8 nm, 3 nm, or the like, and may also be other values in the range, which is not limited herein.

In some embodiments, the dielectric layer 15 does not cover the back surface 3 of the substrate 1 corresponding to the gap region 4. When the first conductive layer 6 is a P-type doped layer and the second conductive layer 7 is an N-type doped layer, the dielectric layer 15 is, for example, a tunnel oxide layer. The tunnel oxide layer allows majority carriers to tunnel into the first conductive layer 6 and the second conductive layer 7 and block the passage of minority carriers, and then the majority carriers are transported transversally within the first conductive layer 6 and the second conductive layer 7 and collected by the first electrode 8 or the second electrode 9. The tunnel oxide layer forms a tunnel oxide passivated contact structure with the first conductive layer 6 and the second conductive layer 7, which can achieve excellent interface passivation and selective collection of carriers, reduce the recombinations of the carriers, and thus improve the photoelectric conversion efficiency of the IBC solar cell. It is to be noted that the tunnel oxide layer may not have a perfect tunnel barrier in practice because it may include, for example, defects such as pinholes, which may cause other charge carrier transport mechanisms (such as drift, diffusion) to dominate the tunnel effect.

In some embodiments, a distance between a top surface and a bottom surface of the first pyramidal texture structure regions 10 ranges from 2 μm to 4 μm. For example, the distance may be 2.0 μm, 2.5 μm, 3.0 μm, 3.5 μm, 4.0 μm, or the like, and may also be other values in the range, which is not limited herein. When the distance between the top surface and the bottom surface of the first pyramidal texture structure regions 10 is limited to the above range, the first pyramidal texture structure regions 10 bring good light trapping and antireflection effects, enabling further improvement of the photoelectric conversion efficiency.

In some embodiments, a distance between a top surface and a bottom surface of the second pyramidal texture structure regions 11 ranges from 1 μm to 3 μm. For example, the distance may be 1 μm, 1.5 μm, 2.0 μm, 2.5 μm, 3.0 μm, or the like, and may also be other values in the range, which is not limited herein. When the distance between the top surface and the bottom surface of the second pyramidal texture structure regions 11 is limited to the above range, the second pyramidal texture structure regions 11 bring good light trapping and antireflection effects, thereby enabling further improvement of the photoelectric conversion efficiency.

In some embodiments, a distance of the boundary region 5 in the first direction D1 ranges from 3 μm to 5 μm. For example, the distance may be 3.0 μm, 3.5 μm, 4.0 μm, 4.5 μm, 5.0 μm, or the like, and may also be other values in the range, which is not limited herein. If the boundary region 5 is excessively wide, an effective area of the back surface 3 may be wasted, and it is difficult to collect effective carriers, thereby reducing the performance of the solar cell. The boundary region 5 cannot bring good insulation effect between positive and negative electrodes if being excessively narrow.

In some embodiments, referring to FIG. 2 and FIG. 3, a distance between a top surface and a bottom surface of the line-pattern concave and convex texture structure 12 ranges from 1 μm to 4 μm. For example, the distance may be 1 μm, 1.5 μm, 2.0 μm, 2.5 μm, 3.0 μm, or the like, and may also be other values in the range, which is not limited herein. When the distance between the top surface and the bottom surface of the line-pattern concave and convex texture structure 12 is limited to the above range, the line-pattern concave and convex texture structure 12 can increase reflection of incident light, thereby enabling further improvement of the photoelectric conversion efficiency.

In some embodiments, a distance of the gap region 4 in the first direction D1 ranges from 50 μm to 200 μm. For example, the distance may be 50 μm, 70 μm, 90 μm, 110 μm, 130 μm, 150 μm, 170 μm, 190 μm, 200 μm, or the like, and may also be other values in the range, which is not limited herein. If the gap region 4 is excessively wide, an effective area of the back surface 3 may be wasted, and it is difficult to collect effective carriers, thereby reducing the performance of the solar cell. The gap region 4 cannot bring good positive and negative insulation effect between positive and negative electrodes if being excessively narrow.

In some embodiments, a distance of the gap region 4 in a normal direction of the back surface 3 of the substrate ranges from 1 μm to 6 μm. For example, the distance may be 1 μm, 2 μm, 3 μm, 4 μm, 5 μm, 6 μm, or the like, and may also be other values in the range, which is not limited herein.

In some embodiments, a ratio of an area of the gap region 4 to an area of the back surface 3 of the substrate 1 ranges from 10% to 35%. For example, the ratio may be 10%, 15%, 20%, 25%, 30%, 35%, or the like, and may also be other values in the range, which is not limited herein. If the area of the gap region 4 is excessively large, the effective area of the back surface 3 may be wasted, and it is difficult to collect effective carriers, thereby reducing the performance of the solar cell. The gap region 4 cannot bring good positive and negative insulation effect between positive and negative electrodes if having an excessively small area.

Based on the above embodiments, the present disclosure further provides a method for manufacturing an N-type solar cell, including the following steps.

Providing a substrate 1, the substrate 1 has a front surface 2 and a back surface 3 opposite to the front surface 2, the back surface 3 has first regions 101 and second regions 102 staggered and spaced from each other in a first direction D1, and gap regions 4 between the first regions 101 and the second regions 102 adjacent to each other;

Forming a first conductive layer 6 over the back surface 3 of the substrate 1;

Performing laser ablation over the back surface 3 of the substrate 1 to remove the first conductive layer 6 located in the second region 102 and the gap region 4;

Forming a second conductive layer 7 over the back surface 3 of the substrate 1;

Forming a first protective layer 18 over a surface of the second conductive layer 7 corresponding to the second region 102;

Removing the second conductive layer 7 not covered by the first protective layer 18;

Removing the first protective layer 18;

Performing texturing to form a plurality of first pyramidal texture structure regions 10 on the back surface 3 corresponding to the gap regions 4 and form a plurality of second pyramidal texture structure regions 11 on the second conductive layer 7, boundary regions are formed between adjacent first pyramidal texture structure regions 10 and adjacent second pyramidal texture structure regions 11, and the back surface 3 is provided with a line-pattern concave and convex texture structure 12 at the boundary region 5; and Forming a first electrode 8 on the first conductive layer 6, and forming a second electrode 9 on the second conductive layer 7.

By use of the solar cell manufactured with the above method, since the design of a partial structure of the IBC solar cell is optimized, the gap region 4 effectively separates the first conductive layer 6 from the second conductive layer 7, which reduces interface recombinations. In addition, boundary regions 5 are formed between adjacent first pyramidal texture structure regions 10 and adjacent second pyramidal texture structure regions 11, and the back surface 3 is provided with a line-pattern concave and convex texture structure 12 at the boundary region 5, so as to increase reflection of incident light on the back surface 3 of the substrate 1, increase the amount of light absorbed by the solar cell, and thus improve conversion efficiency of the solar cell.

Figure 4:
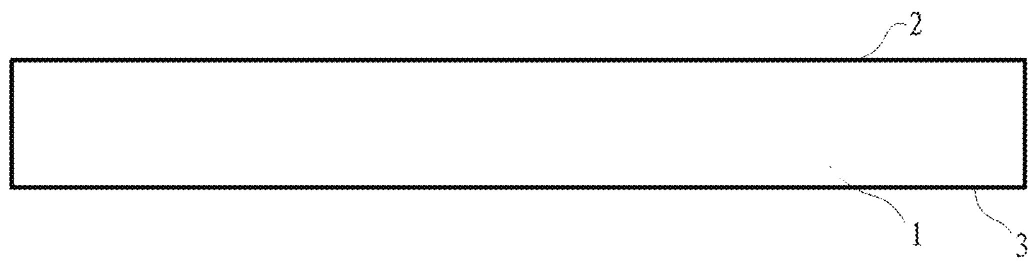
FIG. 4 is a first schematic structural diagram of a solar cell during manufacturing according to one or more embodiments of the present disclosure.

In step S10, referring to FIG. 4, in some embodiments, the substrate 1 is an N-type crystalline silicon substrate 1, the front surface 2 is a light receiving surface facing the direction of sunlight, the back surface 3 is a surface opposite to the front surface 2, the first conductive layer 6 is formed over the first region 101, the second conductive layer 7 is formed over the second region 102, the second conductive layer 7 is of a conductivity type opposite to the first conductive layer 6, and the gap region 4 is configured to separate the first conductive layer 6 from the second conductive layer 7 to improve insulating properties of positive and negative electrodes, prevent leakage of the solar cell, and thus improve reliability of the solar cell.

Figure 5:
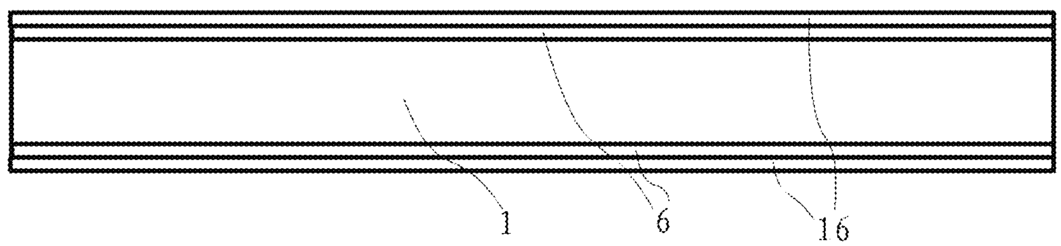
FIG. 5 is a second schematic structural diagram of a solar cell during manufacturing according to one or more embodiments of the present disclosure.
Figure 6:
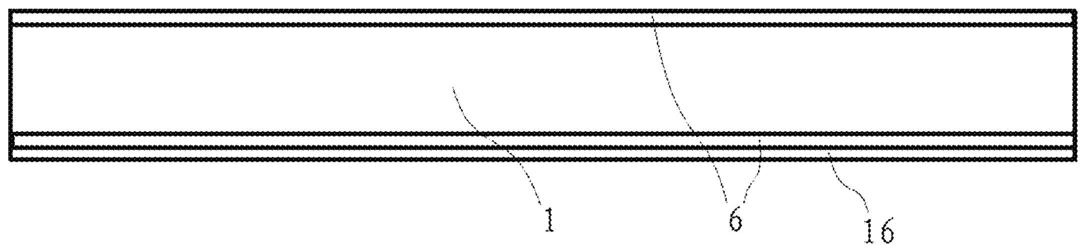
FIG. 6 is a third schematic structural diagram of a solar cell during manufacturing according to one or more embodiments of the present disclosure.

In step S20, referring to FIG. 5 and FIG. 6, the substrate 1 is textured, and a first conductive layer 6 is formed on the back surface 3 of the substrate 1. In some embodiments of the present disclosure, the first conductive layer 6 includes a P-type doped layer (i.e., emitter). Boron is doped into the substrate 1 by diffusion for 2 h to 5 h at a temperature of 800° C. to 1200° C., forming the first conductive layer 6 on the back surface 3 of the N-type silicon substrate 1, with diffusion sheet resistance in a range of 70 ohm/sq to 120 ohm/sq. BSG is also formed by diffusion on the doped layer. A BSG layer 16 plays a role of isolation to better protect the first conductive layer 6. The BSG layer 16 has a thickness in a range of 100 nm to 200 nm. It may be understood that, in a boron diffusion process, a P-type doped layer and part of the BSG layer 16 may also be formed on the front surface 2 of the substrate 1, and this part of BSG is required to be removed. In some embodiments, the BSG layer 16 on the front surface 2 is removed using chain HF acid with concentration in a range of 2% to 15%.

Figure 7:
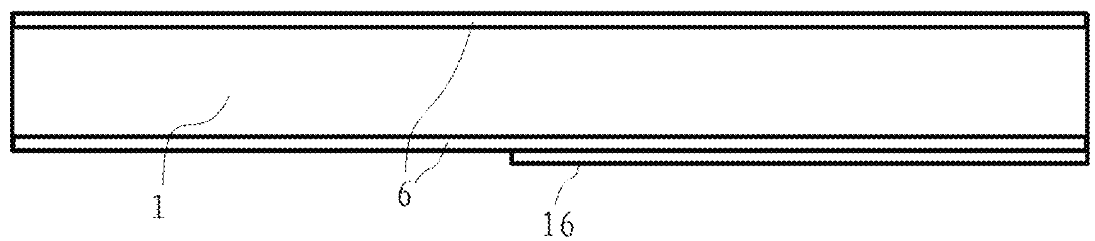
FIG. 7 is a fourth schematic structural diagram of a solar cell during manufacturing according to one or more embodiments of the present disclosure.
Figure 8:
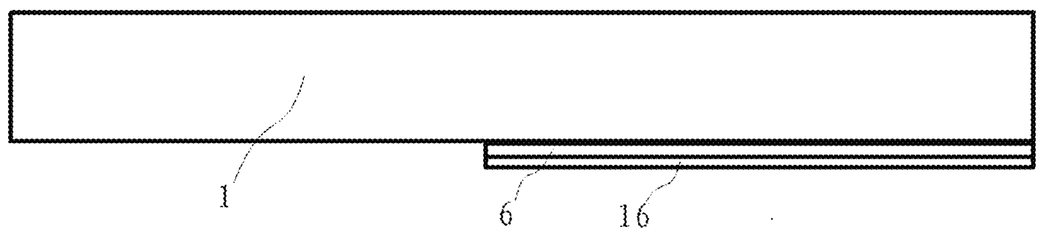
FIG. 8 is a fifth schematic structural diagram of a solar cell during manufacturing according to one or more embodiments of the present disclosure.

In step S30, referring to FIG. 7 and FIG. 8, laser ablation is performed on the back surface 3 of the substrate 1 to remove the first conductive layer 6 located in the second region 102 and the gap region 4. For example, laser ablation is performed on the back surface 3 first, a pattern after laser ablation is interdigitated, and corresponds to a sum of the second region 102 and the gap region 4, the BSG layer 16 in the corresponding regions is removed, and then laser damages are removed by polishing. In some embodiments, laser power ranges from 8 W to 15 W, an ablation width ranges from 300 μm to 600 μm, a polishing temperature is in a range of 50° C. to 65° C., polishing time ranges from 400 s to 800 s, a polishing solution includes NaOH with a volume fraction in a range of 1% to 5% or KOH with a volume fraction in a range of 1% to 3% and an additive with a volume fraction in a range of 0.5% to 2.5%, and a polishing depth is in a range of 2 μm to 5 μm.

Figure 9:
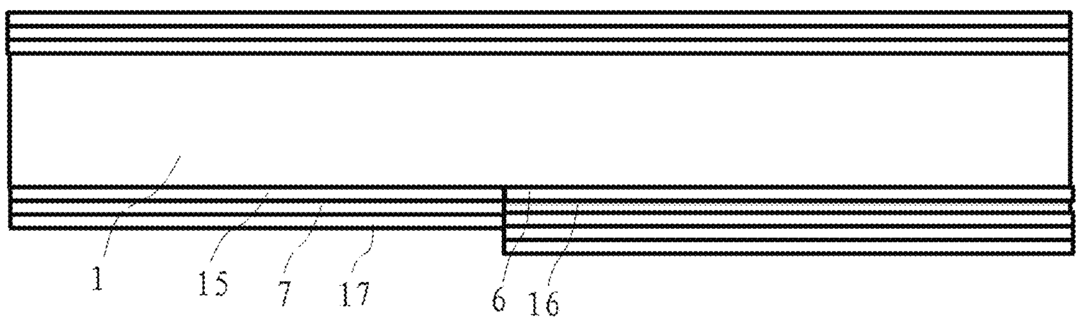
FIG. 9 is a sixth schematic structural diagram of a solar cell during manufacturing according to one or more embodiments of the present disclosure.

In step S40, referring to FIG. 9, a second conductive layer 7 is formed over the back surface 3 of the substrate 1. The second conductive layer 7 includes an N-type doped layer (i.e., base). In some embodiments, a dielectric layer 15 (tunnel oxide layer) is first grown by thermal oxidation. The dielectric layer 15 has a thickness in a range of 0.1 nm to 1 nm. Intrinsic polysilicon is deposited on the dielectric layer 15 by low pressure chemical vapor deposition. The polysilicon has a thickness in a range of 100 nm to 200 nm. Phosphorus is doped into the intrinsic polysilicon by diffusion for 1 h to 3 h at a temperature of 700° C. to 1000° C., forming a passivated contact structure at the back of the N-type silicon substrate 1. The passivated contact structure is a stacked layer of the dielectric layer 15 and the second conductive layer 7. The second conductive layer 7 has sheet resistance in a range of 25 ohm/sq to 45 ohm/sq. PSG is also formed on the N-type polysilicon by diffusion. A PSG layer 17 may serve as a barrier layer, and has a thickness in a range of 20 nm to 100 nm.

Figure 10:
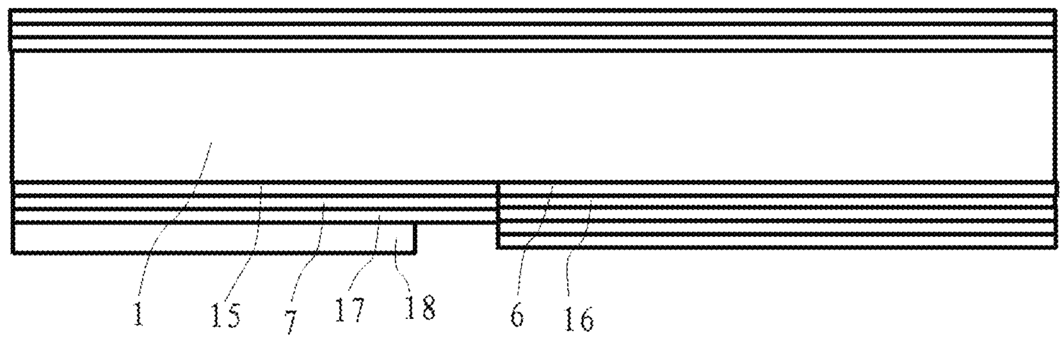
FIG. 10 is a seventh schematic structural diagram of a solar cell during manufacturing according to one or more embodiments of the present disclosure.

In step S50, referring to FIG. 10, a first protective layer 18 is formed on the surface of the second conductive layer 7 corresponding to the second region 102. In some embodiments, the first protective layer 18 is an INK protective layer. The PSG layer 17 of the second conductive layer 7 is coated with an interdigitated INK protective layer by screen printing or ink-jet coating. A pattern of the INK protective layer is an electrode pattern of the IBC solar cell.

In step S60, the second conductive layer 7 not covered by the first protective layer 18 is removed, and then the first protective layer 18 is removed. Then, texturing is performed to form a plurality of first pyramidal texture structure regions 10 on the back surface 3 corresponding to the gap region 4 and form a plurality of second pyramidal texture structure regions 11 on the first conductive layer 6, boundary regions 5 are formed between adjacent first pyramidal texture structure regions 10 and adjacent second pyramidal texture structure regions 11, and the back surface 3 is provided with a line-pattern concave and convex texture structure 12 at the boundary region 5.

Figure 11:
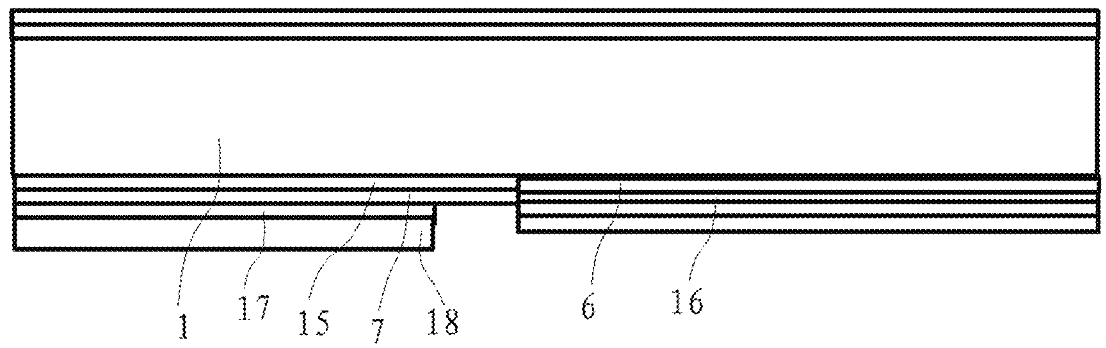
FIG. 11 is an eighth schematic structural diagram of a solar cell during manufacturing according to one or more embodiments of the present disclosure.

In S601, referring to FIG. 11, the PSG layer 17 not covered by the first protective layer 17 is corroded with HF acid with a volume fraction in a range of 1% to 20%, and corrosion time ranges from 5 s to 60 s.

Figure 12:
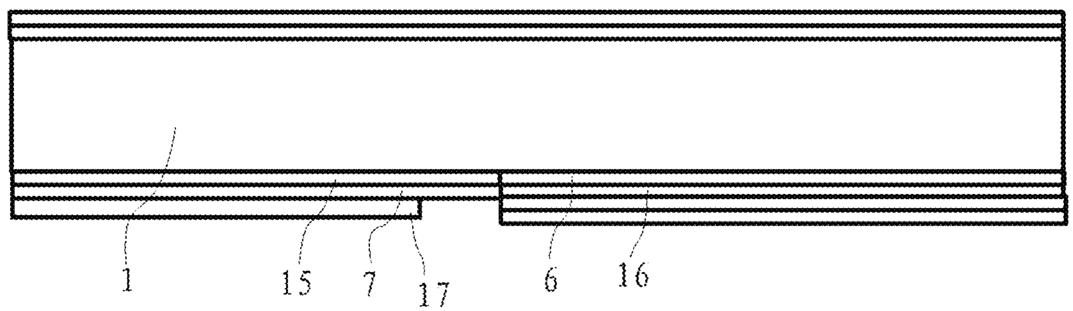
FIG. 12 is a ninth schematic structural diagram of a solar cell during manufacturing according to one or more embodiments of the present disclosure.

In S602, referring to FIG. 12, after the PSG layer 17 not covered by the first protective layer 18 is removed, the first protective layer 18 is washed off with an alkaline solution which is a solution with NaOH concentration in a range of 1% to 10%, to react for 180 s to 300 s.

Figure 13:
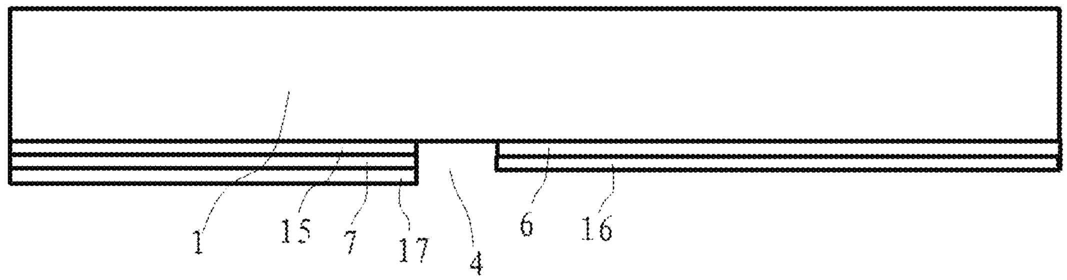
FIG. 13 is a tenth schematic structural diagram of a solar cell during manufacturing according to one or more embodiments of the present disclosure.

In S603, referring to FIG. 13, texturing or alkaline polishing is performed in an alkaline solution which is a solution with NaOH concentration in a range of 0.5% to 5% at a temperature of 60° C. to 80° C. to react for 240 s to 500 s. The second conductive layer 7 not protected by the PSG layer 17 is etched away to form the gap region 4.

Figure 14:
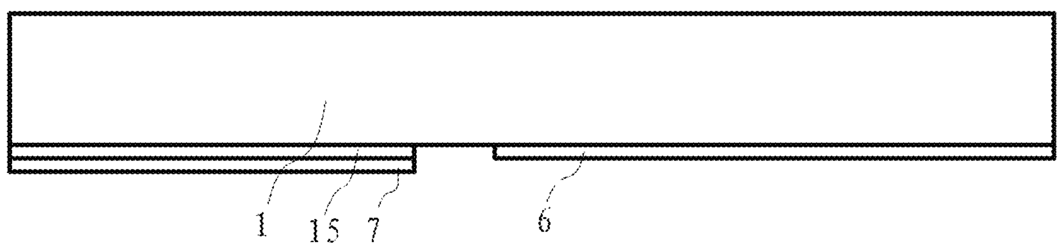
FIG. 14 is an eleventh schematic structural diagram of a solar cell during manufacturing according to one or more embodiments of the present disclosure.

In S603, referring to FIG. 14, RCA cleaning is performed on the textured substrate 1, followed by cleaning in an HF solution with concentration in a range of 1% to 10% to clean the surface of the substrate 1 and remove the dielectric layer 15, the BSG layer 16, and the PSG layer 17 on the surface of the substrate 1, so as to form different profiles in different regions of the back surface 3. First pyramidal texture structure regions 10 are formed in the gap region 4, and a distance (or height) between the top and the bottom of the first pyramidal texture structure regions 10 ranges from 2 μm to 4 μm. A plurality of second pyramidal texture structure regions 11 are formed on the second conductive layer 7, and a distance (or height) between the top and the bottom of the second pyramidal texture structure regions 11 ranges from 1 μm to 3 μm. Boundary regions 5 are formed between adjacent first pyramidal texture structure regions 10 and adjacent second pyramidal texture structure regions 11. The boundary region 5 has a width in a range of 3 μm to 5 μm.

The back surface 3 is provided with a line-pattern concave and convex texture structure 12 at the boundary region 5.

In step S70, referring to FIG. 15 and FIG. 16, a front passivation layer 14 and a back passivation layer 13 are deposited on the front surface 2 and the back surface 3 of the substrate 1 respectively. The front passivation layer 14 is a stacked layer of aluminum oxide, silicon oxide, and silicon nitride, and the back passivation layer 13 is aluminum oxide and silicon nitride. Silver aluminum slurry and silver slurry are printed on the back surface 3 of the substrate 1. The silver aluminum slurry is printed and aligned with the first conductive layer 6 to form the first electrode 8, and the silver slurry is aligned with the second conductive layer 7 to form the second electrode 9, which are sintered to complete metallization.

Figure 17:
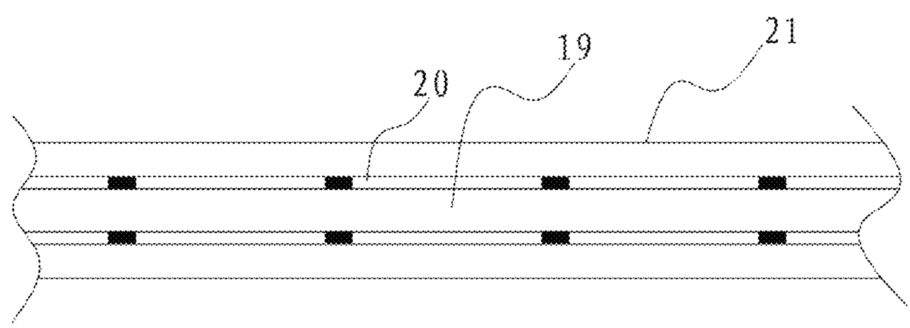
FIG. 17 is a schematic structural diagram of a photovoltaic module according to one or more embodiments of the present disclosure.

Based on the above embodiment, referring to FIG. 17, the present disclosure further provides a photovoltaic module, including: solar cell strings 19, each of the solar cell strings 19 is formed by connecting the solar cells, and adjacent solar cell strings 19 are connected by a conductive strip such as a solder strip; an encapsulation layer 20, the encapsulation layer 20 is configured to cover surfaces of the solar cell strings 19; and a cover plate 21, the cover plate 21 is configured to cover a surface of the encapsulation layer 20 away from the solar cell strings 19.

In some embodiments, at least two solar cell strings 19 are provided. The solar cell strings 19 are electrically connected in parallel and/or in series.

In some embodiments, the encapsulation layer 20 includes encapsulation layers arranged on the front and back of the solar cell strings 19. Materials of the encapsulation layer 20 include, but are not limited to, ethylene vinyl acetate (EVA), polyolefin elastomer (POE), and polyethylene terephthalate (PET) films.

In some embodiments, the cover plate 21 includes cover plates 21 arranged on the front and back of the solar cell strings 19. Materials with good light transmittance are selected for the cover plate 21, including but not limited to glass, plastic, and the like.

Finally, it should be noted that the above embodiments are merely intended to describe the technical solutions of the present disclosure instead of limiting the present disclosure. Although the present disclosure is described in detail with reference to the above embodiments, those of ordinary skill in the art should understand that they can still make modifications to the technical solutions described in the above embodiments, or make equivalent replacements to some or all of the technical features in the technical solutions; and these modifications or replacements do not make the corresponding technical solutions depart from the scope of the technical solutions of the embodiments of the present disclosure, all of which fall within the scope of the claims and the specification of the present disclosure. In particular, the technical features mentioned in various embodiments can be combined in any manner provided that there is no structural conflict. The present disclosure is not limited to the specific embodiments disclosed herein, but includes all technical solutions falling into the protection scope of the claims.

What is claimed is:

1. A method for manufacturing a solar cell, comprising:

providing a substrate having a front surface and a back surface opposite to the front surface, wherein the back surface includes first regions, second regions and gap regions, and the first regions and the second regions are alternately arranged and spaced apart from each other along a first direction with one of the gap regions formed between one of the first regions and one of the second regions adjacent to the one of the first regions;

forming a first conductive layer over the back surface of the substrate;

removing the first conductive layer located in the second regions and the gap regions on the back surface of the substrate;

forming a second conductive layer on the gap regions and the second regions;

forming a first protective layer over a surface of the second conductive layer corresponding to the second regions;

removing portions of the second conductive layer not covered by the first protective layer;

removing the first protective layer;

texturing to form first texture structure regions on the back surface corresponding to the gap regions and form second texture structure regions on the second conductive layer, wherein a boundary region is formed between one of the first texture structure regions and one of the second texture structure regions adjacent to the one of the first texture structure regions, and strip or line-patterned texture structures are formed at the boundary region; and forming a first electrode on the first conductive layer and forming a second electrode on the second conductive layer.

2. The method according to claim 1, wherein the first texture structure regions are different from the second texture structure regions.

3. The method according to claim 2, wherein at least one of the first texture structure regions comprises first pyramid-shaped texture microstructures.

4. The method according to claim 3, wherein a distance between a top surface and a bottom surface of the first pyramid-shaped texture microstructures ranges from 2 μm to 4 μm.

5. The method according to claim 2, wherein at least one of the second texture structure regions comprises second pyramid-shaped texture microstructures.

6. The method according to claim 5, wherein a distance between a top surface and a bottom surface of the second pyramid-shaped texture microstructures ranges from 1 μm to 3 μm.

7. The method according to claim 5, wherein the second pyramid-shaped texture microstructures are quadrangular frustum pyramid-shaped texture microstructures.

8. The method according to claim 1, wherein an extent of the boundary region in the first direction ranges from 3 μm to 5 μm.

9. The method according to claim 1, wherein a distance between a top surface and a bottom surface of the strip or line-patterned texture microstructure ranges from 1 μm to 4 μm.

10. The method according to claim 1, wherein an extent of a gap region of the gap regions in the first direction ranges from 50 μm to 200 μm.

11. The method according to claim 1, wherein an extent of a gap region of the gap regions in a normal direction of the back surface of the substrate ranges from 1 μm to 6 μm.

12. The method according to claim 1, wherein a ratio of a total area of the gap regions to an area of the back surface of the substrate ranges from 10% to 35%.

13. The method according to claim 1, wherein two opposite ends of the strip or line-patterned texture microstructures are respectively in contact with the first texture structure regions and the second texture structure regions.

14. The method according to claim 1, wherein the first protective layer is an ink protective layer.

15. The method according to claim 1, wherein the first conductive layer has a conductive type opposite to the second conductive layer.

16. The method according to claim 15, wherein the substrate is an N-type substrate, the first conductive layer includes a P-type doping layer, and the second conductive layer includes a N-type doping layer.

17. The method according to claim 1, wherein a dielectric layer is formed between at least one of the first conductive layer or the second conductive layer and the back surface of the substrate.

18. The method according to claim 17, wherein the dielectric layer includes at least one of silicon oxide, aluminum oxide, hafnium oxide, silicon nitride, or silicon oxynitride.

19. The method according to claim 17, wherein the dielectric layer has a thickness in a range of 0.5 nm to 3 nm.

20. The method according to claim 17, wherein the dielectric layer does not cover the back surface of the substrate corresponding to the gap regions.

* * * * *